United States Patent
Holt, Jr.

(10) Patent No.: US 9,466,870 B2
(45) Date of Patent: Oct. 11, 2016

(54) ELECTRICITY METER ANTENNA CONFIGURATION

(71) Applicant: Elster Solutions, LLC, Raleigh, NC (US)

(72) Inventor: John R. Holt, Jr., Wake Forest, NC (US)

(73) Assignee: Elster Solutions, LLC, Raleigh, NC (US)

( * ) Notice: Subject to any disclaimer, the term of this patent is extended or adjusted under 35 U.S.C. 154(b) by 236 days.

(21) Appl. No.: 14/230,658

(22) Filed: Mar. 31, 2014

(65) Prior Publication Data

US 2015/0280308 A1    Oct. 1, 2015

(51) Int. Cl.
| | |
|---|---|
| *H01Q 1/24* | (2006.01) |
| *H01Q 1/22* | (2006.01) |
| *H01Q 1/52* | (2006.01) |
| *H01Q 1/38* | (2006.01) |
| *G01R 22/06* | (2006.01) |

(52) U.S. Cl.
CPC .............. *H01Q 1/2233* (2013.01); *H01Q 1/38* (2013.01); *H01Q 1/526* (2013.01); *G01R 22/063* (2013.01)

(58) Field of Classification Search
CPC ....... H01Q 1/38; H01Q 1/2233; H01Q 1/243
USPC .......................................... 343/700 MS, 702
See application file for complete search history.

(56) References Cited

U.S. PATENT DOCUMENTS

| | | | |
|---|---|---|---|
| 6,304,231 B1 * | 10/2001 | Reed ...................... | G01D 4/004 343/702 |
| 6,459,916 B1 | 10/2002 | Suguro | |
| 7,196,673 B2 | 3/2007 | Savage et al. | |
| 7,250,910 B2 * | 7/2007 | Yoshikawa ............... | H01Q 1/24 343/702 |
| 7,265,719 B1 | 9/2007 | Moosbrugger et al. | |
| 7,372,373 B2 | 5/2008 | Borisov et al. | |
| 7,671,814 B2 | 3/2010 | Savage et al. | |
| 7,692,600 B1 * | 4/2010 | Pakosz ................. | H01Q 1/2233 343/795 |
| 7,843,391 B2 | 11/2010 | Borisov et al. | |
| 7,994,994 B2 | 8/2011 | Savage et al. | |
| 8,188,884 B2 | 5/2012 | Randall et al. | |
| 8,228,209 B2 | 7/2012 | Smith | |
| 8,284,107 B2 | 10/2012 | Borisov et al. | |
| 8,299,975 B2 | 10/2012 | Savage et al. | |
| 8,344,955 B2 | 1/2013 | Niemi | |
| 8,462,060 B2 | 6/2013 | Savage et al. | |
| 2001/0007444 A1 | 7/2001 | Porter et al. | |

(Continued)

FOREIGN PATENT DOCUMENTS

RU           2291598         10/2007

*Primary Examiner* — Hoanganh Le
(74) *Attorney, Agent, or Firm* — Baker & Hostetler LLP

(57) ABSTRACT

An improved electricity meter antenna configuration is disclosed herein. An electricity meter may include, for example, a radio, a first printed circuit board element, a second printed circuit board element and a flexible printed circuit element. The first printed circuit board element may be, for example, a main printed circuit board to which one or more electrical components are attached. The flexible printed circuit element may include at least a portion of an antenna element that is connected to the radio. In some cases, the second printed circuit board element may serve to shield the antenna element on the flexible printed circuit element from noise generated by electrical components on the first printed circuit board element. In some cases, an electrical connection path between the antenna element and the radio may be configured such that it does not include any coaxial cabling.

19 Claims, 12 Drawing Sheets

(56) References Cited

U.S. PATENT DOCUMENTS

| | | |
|---|---|---|
| 2008/0173099 A1* | 7/2008 | Ban .................. G01F 1/684 73/861 |
| 2009/0091508 A1 | 4/2009 | Fabrega-Sanchez et al. |
| 2010/0253538 A1 | 10/2010 | Smith |
| 2011/0063172 A1 | 3/2011 | Podduturi |
| 2011/0149544 A1 | 6/2011 | Khan |
| 2011/0313708 A1 | 12/2011 | Jin et al. |
| 2012/0262188 A1 | 10/2012 | Nickel et al. |
| 2013/0093641 A1 | 4/2013 | Ng et al. |
| 2013/0095877 A1 | 4/2013 | Smith et al. |
| 2013/0169504 A1 | 7/2013 | Jenwatanavet |
| 2013/0203364 A1 | 8/2013 | Darnell et al. |
| 2015/0022401 A1* | 1/2015 | Gavilan .............. H01Q 21/28 343/702 |

\* cited by examiner

ELECTRICITY METER ANTENNA CONFIGURATION

TECHNICAL BACKGROUND

Electricity meters may often include one or more radios for communicating with external devices such as collectors, relays, other meters, and other control and communication devices. However, incorporating one or more radios within an electricity meter presents a number of problems related to antenna design and placement. For example, it may be difficult to include one or more radios and their antennas within the limited size and shape of the meter housing. One approach to these problems relies on cabling from the interior of the meter to external antennas that are outside of the meter housing. These external antennas may sometimes be formed on flexible printed circuit board material attached to the sides or face of the meter housing. However, antennas that are external to the meter housing may be problematic for a number of reasons. For example, antennas that are external to the meter housing may require the use of cabling, may be expensive, may require complex installation and may require an isolation circuit to protect persons from dangerous high voltage potential.

Existing designs of internally located antennas are also problematic. For example, one problem related to internal antennas is that the physical presence of other devices and circuitry within the meter can be a source of electrical noise that is coupled to the antennas and is thus is a potential source of interference.

Generally, planar antennas printed on the meter's main printed circuit board are an effective, inexpensive approach. However, such planar antennas may require a certain amount of board area to be efficient radiators. In many cases, there may not be sufficient area on a main printed circuit board to include one or more antennas along with other necessary electrical components. In some cases, discrete antennas may be attached or soldered to the main meter board. However, this does not significantly improve the situation since these antennas require a ground plane and clear area devoid of circuit components to achieve useable antenna efficiency.

SUMMARY OF THE DISCLOSURE

An improved electricity meter antenna configuration is disclosed herein. An electricity meter may include, for example, a radio, a first printed circuit board element, a second printed circuit board element and a flexible printed circuit element. The first printed circuit board element may be, for example, a main printed circuit board to which one or more electrical components are attached. Such electrical components may generate noise that interferes with radio communications. The flexible printed circuit element may include at least a portion of an antenna element that is connected to the radio through an electrical connection path. In some cases, the flexible printed circuit element may be configured to conform to a shape of a portion of a meter housing such as a round or circular shape.

In some cases, at least a portion of the second printed circuit board element may be positioned between the first printed circuit board element and the flexible printed circuit element. The second printed circuit board element may, for example, be positioned such that it is non-parallel and, in some cases, orthogonal with respect to the first printed circuit board element. In some cases, the second printed circuit board element may serve to shield the antenna element on the flexible printed circuit element from noise generated by electrical components on the first printed circuit board element. In some cases, the electrical connection path between the antenna element and the radio may be configured such that it does not include any coaxial cabling.

Other features and advantages of the described embodiments may become apparent from the following detailed description and accompanying drawings.

BRIEF DESCRIPTION OF THE DRAWINGS

The foregoing summary, as well as the following detailed description of various embodiments, is better understood when read in conjunction with the appended drawings. For the purpose of illustrating the invention, there are shown in the drawings exemplary embodiments of various aspects of the invention; however, the invention is not limited to the specific methods and instrumentalities disclosed. In the drawings.

DETAILED DESCRIPTION OF ILLUSTRATIVE EMBODIMENTS

Exemplary systems and methods for gathering meter data are described below with reference to the figures. It will be appreciated by those of ordinary skill in the art that the description given herein with respect to those figures is for exemplary purposes only and is not intended in any way to limit the scope of potential embodiments.

Generally, a plurality of meter devices, which operate to track usage of a service or commodity such as, for example, electricity, water, and gas, are operable to wirelessly communicate. One or more devices, referred to herein as "collectors," are provided that "collect" data transmitted by the other meter devices so that it can be accessed by other computer systems. The collectors receive and compile metering data from a plurality of meter devices via wireless communications. A data collection server may communicate with the collectors to retrieve the compiled meter data.

Figure 1:
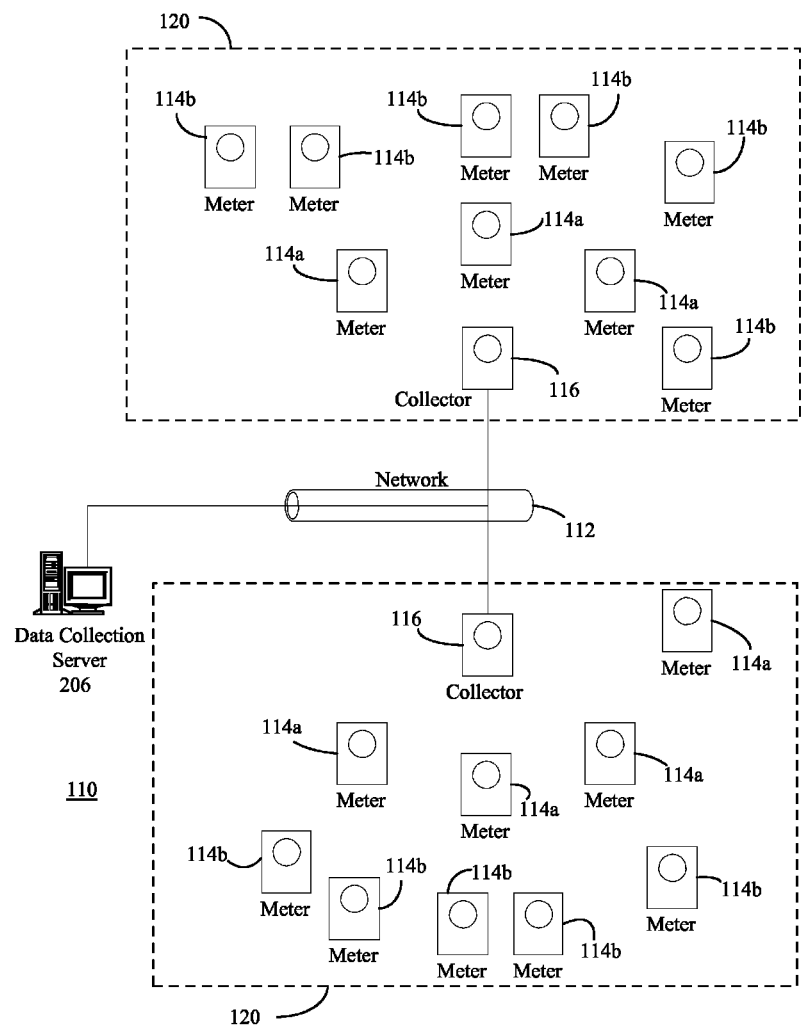
FIG. 1 is a diagram of an exemplary metering system.

FIG. 1 provides a diagram of one exemplary metering system 110. System 110 comprises a plurality of meters 114, which are operable to sense and record consumption or usage of a service or commodity such as, for example, electricity, water, or gas. Meters 114 may be located at customer premises such as, for example, a home or place of business. Meters 114 comprise circuitry for measuring the consumption of the service or commodity being consumed at their respective locations and for generating data reflecting the consumption, as well as other data related thereto. Meters 114 may also comprise circuitry for wirelessly transmitting data generated by the meter to a remote location. Meters 114 may further comprise circuitry for receiving data, commands or instructions wirelessly as well. Meters that are operable to both receive and transmit data may be referred to as "bi-directional" or "two-way" meters, while meters that are only capable of transmitting data may be referred to as "transmit-only" or "one-way" meters. In bi-directional meters, the circuitry for transmitting and receiving may comprise a transceiver. In an illustrative embodiment, meters 114 may be, for example, electricity meters manufactured by Elster Solutions, LLC and marketed under the tradename REX.

System 110 further comprises collectors 116. In one embodiment, collectors 116 are also meters operable to detect and record usage of a service or commodity such as, for example, electricity, water, or gas. In addition, collectors 116 are operable to send data to and receive data from meters 114. Thus, like the meters 114, the collectors 116 may comprise both circuitry for measuring the consumption of a service or commodity and for generating data reflecting the consumption and circuitry for transmitting and receiving data. In one embodiment, collector 116 and meters 114 communicate with and amongst one another using any one of several wireless techniques such as, for example, frequency hopping spread spectrum (FHSS) and direct sequence spread spectrum (DSSS).

A collector 116 and the meters 114 with which it communicates define a subnet/LAN 120 of system 110. As used herein, meters 114 and collectors 116 may be referred to as "nodes" in the subnet 120. In each subnet/LAN 120, each meter transmits data related to consumption of the commodity being metered at the meter's location. The collector 116 receives the data transmitted by each meter 114, effectively "collecting" it, and then periodically transmits the data from all of the meters in the subnet/LAN 120 to a data collection server 206. The data collection server 206 stores the data for analysis and preparation of bills, for example. The data collection server 206 may be a specially programmed general purpose computing system and may communicate with collectors 116 via a network 112. The network 112 may comprise any form of network, including a wireless network or a fixed-wire network, such as a local area network (LAN), a wide area network, the Internet, an intranet, a telephone network, such as the public switched telephone network (PSTN), a Frequency Hopping Spread Spectrum (FHSS) radio network, a mesh network, a Wi-Fi (802.11) network, a Wi-Max (802.16) network, a land line (POTS) network, or any combination of the above.

Figure 2:
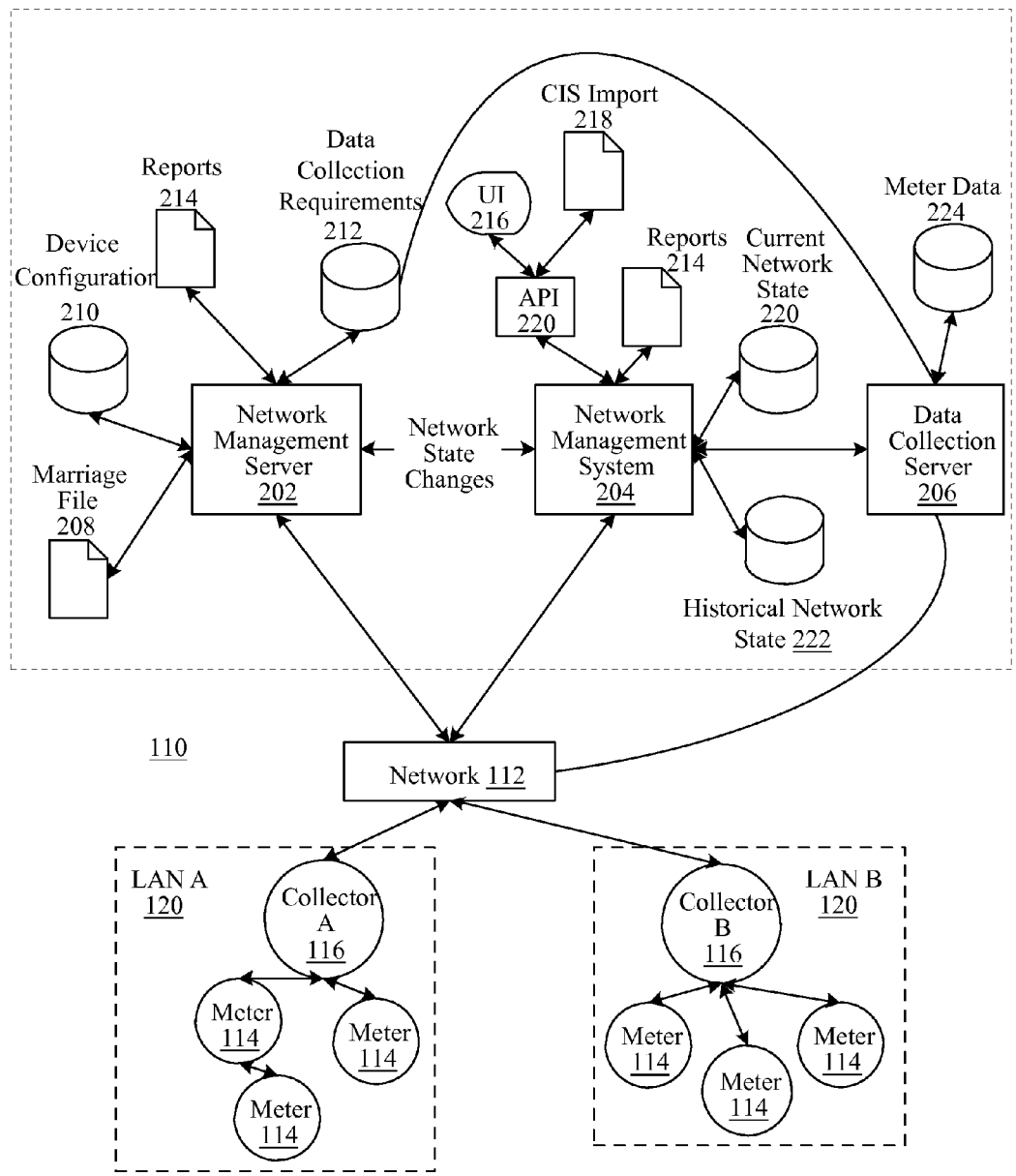
FIG. 2 expands upon the diagram of FIG. 1 and illustrates an exemplary metering system in greater detail.

Referring now to FIG. 2, further details of the metering system 110 are shown. Typically, the system will be operated by a utility company or a company providing information technology services to a utility company. As shown, the system 110 comprises a network management server 202, a network management system (NMS) 204 and the data collection server 206 that together manage one or more subnets/LANs 120 and their constituent nodes. The NMS 204 tracks changes in network state, such as new nodes registering/unregistering with the system 110, node communication paths changing, etc. This information is collected for each subnet/LAN 120 and is detected and forwarded to the network management server 202 and data collection server 206.

Each of the meters 114 and collectors 116 is assigned an identifier (LAN ID) that uniquely identifies that meter or collector on its subnet/LAN 120. In this embodiment, communication between nodes (i.e., the collectors and meters) and the system 110 is accomplished using the LAN ID. However, it is preferable for operators of a utility to query and communicate with the nodes using their own identifiers. To this end, a marriage file 208 may be used to correlate a utility's identifier for a node (e.g., a utility serial number) with both a manufacturer serial number (i.e., a serial number assigned by the manufacturer of the meter) and the LAN ID for each node in the subnet/LAN 120. In this manner, the utility can refer to the meters and collectors by the utilities identifier, while the system can employ the LAN ID for the purpose of designating particular meters during system communications.

A device configuration database 210 stores configuration information regarding the nodes. For example, in the metering system 200, the device configuration database may include data regarding time of use (TOU) switchpoints, etc. for the meters 114 and collectors 116 communicating in the system 110. A data collection requirements database 212 contains information regarding the data to be collected on a per node basis. For example, a utility may specify that metering data such as load profile, demand, TOU, etc. is to be collected from particular meter(s) 114a. Reports 214 containing information on the network configuration may be automatically generated or in accordance with a utility request.

The network management system (NMS) 204 maintains a database describing the current state of the global fixed network system (current network state 220) and a database describing the historical state of the system (historical network state 222). The current network state 220 contains data regarding current meter-to-collector assignments, etc. for each subnet/LAN 120. The historical network state 222 is a database from which the state of the network at a particular point in the past can be reconstructed. The NMS 204 is responsible for, amongst other things, providing reports 214 about the state of the network. The NMS 204 may be accessed via an API 220 that is exposed to a user interface 216 and a Customer Information System (CIS) 218. Other external interfaces may also be implemented. In addition, the data collection requirements stored in the database 212 may be set via the user interface 216 or CIS 218.

The data collection server 206 collects data from the nodes (e.g., collectors 116) and stores the data in a database 224. The data includes metering information, such as energy consumption and may be used for billing purposes, etc. by a utility provider.

The network management server 202, network management system 204 and data collection server 206 communicate with the nodes in each subnet/LAN 120 via network 110.

Figure 3A:
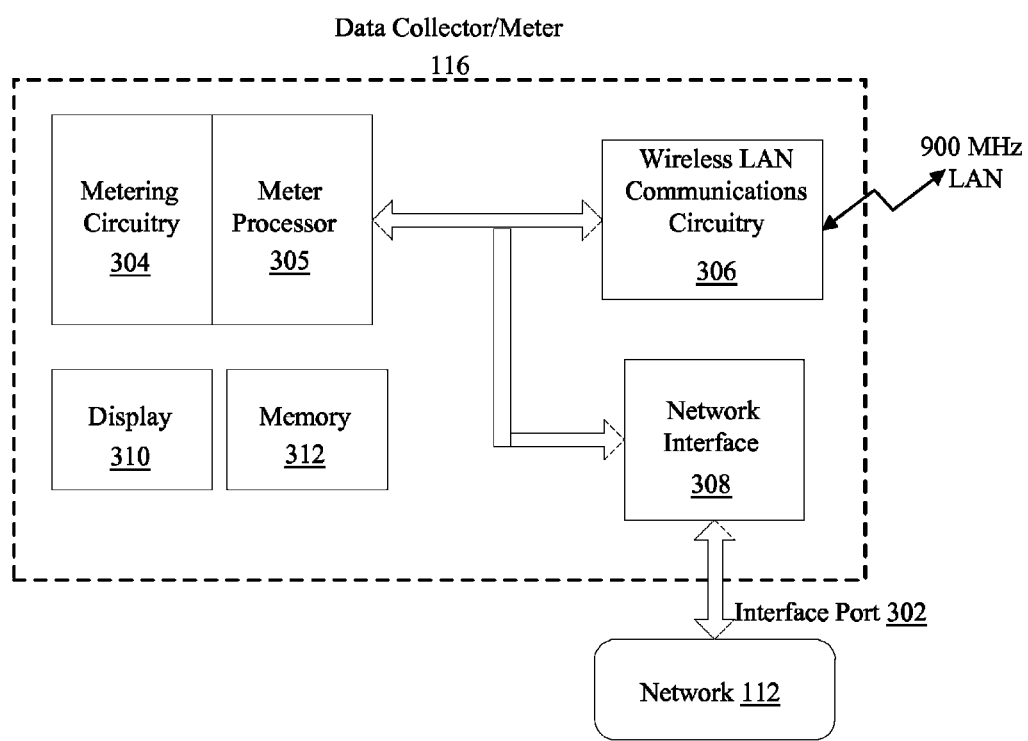
FIG. 3A is a block diagram illustrating an exemplary collector.

FIG. 3A is a block diagram illustrating further details of one embodiment of a collector 116. Although certain components are designated and discussed with reference to FIG. 3A, it should be appreciated that the invention is not limited to such components. In fact, various other components typically found in an electronic meter may be a part of collector 116, but have not been shown in FIG. 3A for the purposes of clarity and brevity. Also, the invention may use other components to accomplish the operation of collector 116. The components that are shown and the functionality described for collector 116 are provided as examples, and are not meant to be exclusive of other components or other functionality.

As shown in FIG. 3A, collector 116 may comprise metering circuitry 304 that performs measurement of consumption of a service or commodity and a processor 305 that controls the overall operation of the metering functions of the collector 116. The collector 116 may further comprise a display 310 for displaying information such as measured quantities and meter status and a memory 312 for storing data. The collector 116 further comprises wireless LAN communications circuitry 306 for communicating wirelessly with the meters 114 in a subnet/LAN and a network interface 308 for communication over the network 112.

In one embodiment, the metering circuitry 304, processor 305, display 310 and memory 312 are implemented using an A3 ALPHA meter available from Elster Electricity, Inc. In that embodiment, the wireless LAN communications circuitry 306 may be implemented by a LAN Option Board (e.g., a 900 MHz two-way radio) installed within the A3 ALPHA meter, and the network interface 308 may be implemented by a WAN Option Board (e.g., a telephone modem) also installed within the A3 ALPHA meter. In this embodiment, the WAN Option Board 308 routes messages from network 112 (via interface port 302) to either the meter processor 305 or the LAN Option Board 306. LAN Option Board 306 may use a transceiver (not shown), for example a 900 MHz radio, to communicate data to meters 114. Also, LAN Option Board 306 may have sufficient memory to store data received from meters 114. This data may include, but is not limited to the following: current billing data (e.g., the present values stored and displayed by meters 114), previous billing period data, previous season data, and load profile data.

LAN Option Board 306 may be capable of synchronizing its time to a real time clock (not shown) in A3 ALPHA meter, thereby synchronizing the LAN reference time to the time in the meter. The processing necessary to carry out the communication functionality and the collection and storage of metering data of the collector 116 may be handled by the processor 305 and/or additional processors (not shown) in the LAN Option Board 306 and the WAN Option Board 308.

The responsibility of a collector 116 is wide and varied. Generally, collector 116 is responsible for managing, processing and routing data communicated between the collector and network 112 and between the collector and meters 114. Collector 116 may continually or intermittently read the current data from meters 114 and store the data in a database (not shown) in collector 116. Such current data may include but is not limited to the total kWh usage, the Time-Of-Use (TOU) kWh usage, peak kW demand, and other energy consumption measurements and status information. Collector 116 also may read and store previous billing and previous season data from meters 114 and store the data in the database in collector 116. The database may be implemented as one or more tables of data within the collector 116.

Figure 3B:
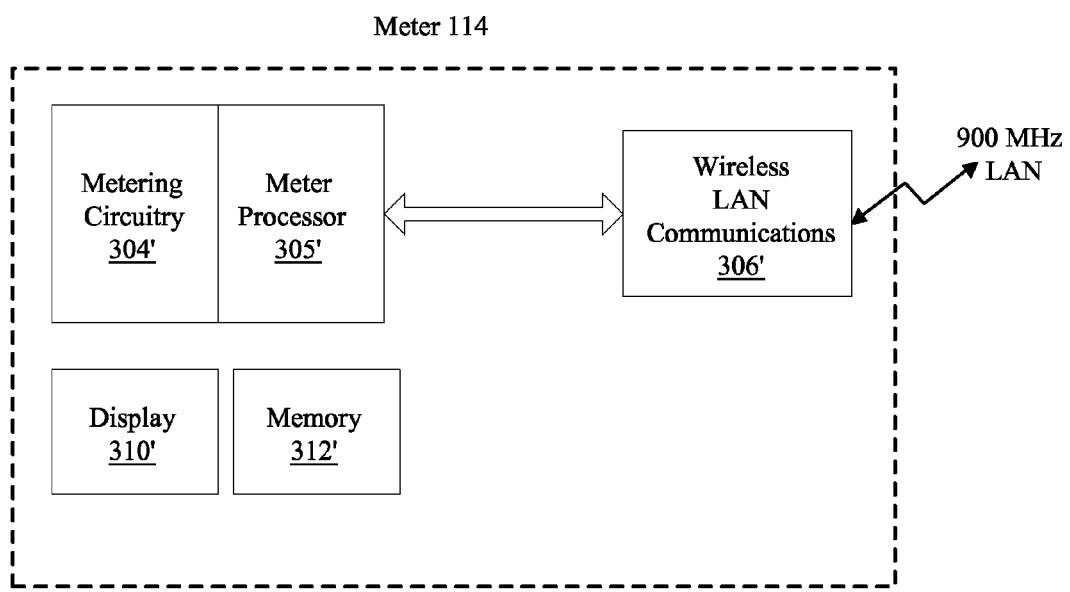
FIG. 3B is a block diagram illustrating an exemplary meter.

FIG. 3B is a block diagram of an exemplary embodiment of a meter 114 that may operate in the system 110 of FIGS. 1 and 2. As shown, the meter 114 comprises metering circuitry 304' for measuring the amount of a service or commodity that is consumed, a processor 305' that controls the overall functions of the meter, a display 310' for displaying meter data and status information, and a memory 312' for storing data and program instructions. The meter 114 further comprises wireless communications circuitry 306' for transmitting and receiving data to/from other meters 114 or a collector 116.

Referring again to FIG. 1, in the exemplary embodiment shown, a collector 116 directly communicates with only a subset of the plurality of meters 114 in its particular subnet/LAN. Meters 114 with which collector 116 directly communicates may be referred to as "level one" meters 114a. The level one meters 114a are said to be one "hop" from the collector 116. Communications between collector 116 and meters 114 other than level one meters 114a are relayed through the level one meters 114a. Thus, the level one meters 114a operate as repeaters for communications between collector 116 and meters 114 located further away in subnet 120.

Each level one meter 114a typically will only be in range to directly communicate with only a subset of the remaining meters 114 in the subnet 120. The meters 114 with which the level one meters 114a directly communicate may be referred to as level two meters 114b. Level two meters 114b are one "hop" from level one meters 114a, and therefore two "hops" from collector 116. Level two meters 114b operate as repeaters for communications between the level one meters 114a and meters 114 located further away from collector 116 in the subnet 120.

While only three levels of meters are shown (collector 116, first level 114a, second level 114b) in FIG. 1, a subnet 120 may comprise any number of levels of meters 114. For example, a subnet 120 may comprise one level of meters but might also comprise eight or more levels of meters 114. In an embodiment wherein a subnet comprises eight levels of meters 114, as many as 1024 meters might be registered with a single collector 116.

As mentioned above, each meter 114 and collector 116 that is installed in the system 110 has a unique identifier (LAN ID) stored thereon that uniquely identifies the device from all other devices in the system 110. Additionally, meters 114 operating in a subnet 120 comprise information including the following: data identifying the collector with which the meter is registered; the level in the subnet at which the meter is located; the repeater meter at the prior level with which the meter communicates to send and receive data to/from the collector; an identifier indicating whether the meter is a repeater for other nodes in the subnet; and if the meter operates as a repeater, the identifier that uniquely identifies the repeater within the particular subnet, and the number of meters for which it is a repeater. Collectors 116 have stored thereon all of this same data for all meters 114 that are registered therewith. Thus, collector 116 comprises data identifying all nodes registered therewith as well as data identifying the registered path by which data is communicated from the collector to each node. Each meter 114 therefore has a designated communications path to the collector that is either a direct path (e.g., all level one nodes) or an indirect path through one or more intermediate nodes that serve as repeaters.

Information is transmitted in this embodiment in the form of packets. For most network tasks such as, for example, reading meter data, collector 116 communicates with meters 114 in the subnet 120 using point-to-point transmissions. For example, a message or instruction from collector 116 is routed through the designated set of repeaters to the desired meter 114. Similarly, a meter 114 communicates with collector 116 through the same set of repeaters, but in reverse.

In some instances, however, collector 116 may need to quickly communicate information to all meters 114 located in its subnet 120. Accordingly, collector 116 may issue a broadcast message that is meant to reach all nodes in the subnet 120. The broadcast message may be referred to as a "flood broadcast message." A flood broadcast originates at collector 116 and propagates through the entire subnet 120 one level at a time. For example, collector 116 may transmit a flood broadcast to all first level meters 114a. The first level meters 114a that receive the message pick a random time slot and retransmit the broadcast message to second level meters 114b. Any second level meter 114b can accept the broadcast, thereby providing better coverage from the collector out to the end point meters. Similarly, the second level meters 114b that receive the broadcast message pick a random time slot and communicate the broadcast message to third level meters. This process continues out until the end nodes of the subnet. Thus, a broadcast message gradually propagates outward from the collector to the nodes of the subnet 120.

The flood broadcast packet header contains information to prevent nodes from repeating the flood broadcast packet more than once per level. For example, within a flood broadcast message, a field might exist that indicates to meters/nodes which receive the message, the level of the subnet the message is located; only nodes at that particular level may re-broadcast the message to the next level. If the collector broadcasts a flood message with a level of 1, only level 1 nodes may respond. Prior to re-broadcasting the flood message, the level 1 nodes increment the field to 2 so that only level 2 nodes respond to the broadcast. Information within the flood broadcast packet header ensures that a flood broadcast will eventually die out.

Generally, a collector 116 issues a flood broadcast several times, e.g. five times, successively to increase the probability that all meters in the subnet 120 receive the broadcast. A delay is introduced before each new broadcast to allow the previous broadcast packet time to propagate through all levels of the subnet.

Meters 114 may have a clock formed therein. However, meters 114 often undergo power interruptions that can interfere with the operation of any clock therein. Accordingly, the clocks internal to meters 114 cannot be relied upon to provide an accurate time reading. Having the correct time is necessary, however, when time of use metering is being employed. Indeed, in an embodiment, time of use schedule data may also be comprised in the same broadcast message as the time. Accordingly, collector 116 periodically flood broadcasts the real time to meters 114 in subnet 120. Meters 114 use the time broadcasts to stay synchronized with the rest of the subnet 120. In an illustrative embodiment, collector 116 broadcasts the time every 15 minutes. The broadcasts may be made near the middle of 15 minute clock boundaries that are used in performing load profiling and time of use (TOU) schedules so as to minimize time changes near these boundaries. Maintaining time synchronization is important to the proper operation of the subnet 120. Accordingly, lower priority tasks performed by collector 116 may be delayed while the time broadcasts are performed.

In an illustrative embodiment, the flood broadcasts transmitting time data may be repeated, for example, five times, so as to increase the probability that all nodes receive the time. Furthermore, where time of use schedule data is communicated in the same transmission as the timing data, the subsequent time transmissions allow a different piece of the time of use schedule to be transmitted to the nodes.

Exception messages are used in subnet 120 to transmit unexpected events that occur at meters 114 to collector 116. In an embodiment, the first 4 seconds of every 32-second period are allocated as an exception window for meters 114 to transmit exception messages. Meters 114 transmit their exception messages early enough in the exception window so the message has time to propagate to collector 116 before the end of the exception window. Collector 116 may process the exceptions after the 4-second exception window. Generally, a collector 116 acknowledges exception messages, and collector 116 waits until the end of the exception window to send this acknowledgement.

In an illustrative embodiment, exception messages are configured as one of three different types of exception messages: local exceptions, which are handled directly by the collector 116 without intervention from data collection server 206; an immediate exception, which is generally relayed to data collection server 206 under an expedited schedule; and a daily exception, which is communicated to the communication server 122 on a regular schedule.

Exceptions are processed as follows. When an exception is received at collector 116, the collector 116 identifies the type of exception that has been received. If a local exception has been received, collector 116 takes an action to remedy the problem. For example, when collector 116 receives an exception requesting a "node scan request" such as discussed below, collector 116 transmits a command to initiate a scan procedure to the meter 114 from which the exception was received.

If an immediate exception type has been received, collector 116 makes a record of the exception. An immediate exception might identify, for example, that there has been a power outage. Collector 116 may log the receipt of the exception in one or more tables or files. In an illustrative example, a record of receipt of an immediate exception is made in a table referred to as the "Immediate Exception Log Table." Collector 116 then waits a set period of time before taking further action with respect to the immediate exception. For example, collector 116 may wait 64 seconds. This delay period allows the exception to be corrected before communicating the exception to the data collection server 206. For example, where a power outage was the cause of the immediate exception, collector 116 may wait a set period of time to allow for receipt of a message indicating the power outage has been corrected.

If the exception has not been corrected, collector 116 communicates the immediate exception to data collection server 206. For example, collector 116 may initiate a dial-up connection with data collection server 206 and download the exception data. After reporting an immediate exception to data collection server 206, collector 116 may delay reporting any additional immediate exceptions for a period of time such as ten minutes. This is to avoid reporting exceptions from other meters 114 that relate to, or have the same cause as, the exception that was just reported.

If a daily exception was received, the exception is recorded in a file or a database table. Generally, daily exceptions are occurrences in the subnet 120 that need to be reported to data collection server 206, but are not so urgent that they need to be communicated immediately. For example, when collector 116 registers a new meter 114 in subnet 120, collector 116 records a daily exception identifying that the registration has taken place. In an illustrative embodiment, the exception is recorded in a database table referred to as the "Daily Exception Log Table." Collector 116 communicates the daily exceptions to data collection server 206. Generally, collector 116 communicates the daily exceptions once every 24 hours.

In the present embodiment, a collector assigns designated communications paths to meters with bi-directional communication capability, and may change the communication paths for previously registered meters if conditions warrant. For example, when a collector 116 is initially brought into system 110, it needs to identify and register meters in its subnet 120. A "node scan" refers to a process of communication between a collector 116 and meters 114 whereby the collector may identify and register new nodes in a subnet 120 and allow previously registered nodes to switch paths. A collector 116 can implement a node scan on the entire subnet, referred to as a "full node scan," or a node scan can be performed on specially identified nodes, referred to as a "node scan retry."

A full node scan may be performed, for example, when a collector is first installed. The collector 116 must identify and register nodes from which it will collect usage data. The collector 116 initiates a node scan by broadcasting a request, which may be referred to as a Node Scan Procedure request. Generally, the Node Scan Procedure request directs that all unregistered meters 114 or nodes that receive the request respond to the collector 116. The request may comprise information such as the unique address of the collector that initiated the procedure. The signal by which collector 116 transmits this request may have limited strength and therefore is detected only at meters 114 that are in proximity of collector 116. Meters 114 that receive the Node Scan Procedure request respond by transmitting their unique identifier as well as other data.

For each meter from which the collector receives a response to the Node Scan Procedure request, the collector tries to qualify the communications path to that meter before registering the meter with the collector. That is, before registering a meter, the collector 116 attempts to determine whether data communications with the meter will be sufficiently reliable. In one embodiment, the collector 116 determines whether the communication path to a responding meter is sufficiently reliable by comparing a Received Signal Strength Indication (RSSI) value (i.e., a measurement of the received radio signal strength) measured with respect to the received response from the meter to a selected threshold value. For example, the threshold value may be −60 dBm. RSSI values above this threshold would be deemed sufficiently reliable. In another embodiment, qualification is performed by transmitting a predetermined number of additional packets to the meter, such as ten packets, and counting the number of acknowledgements received back from the meter. If the number of acknowledgments received is greater than or equal to a selected threshold (e.g., 8 out of 10), then the path is considered to be reliable. In other embodiments, a combination of the two qualification techniques may be employed.

If the qualification threshold is not met, the collector 116 may add an entry for the meter to a "Straggler Table." The entry includes the meter's LAN ID, its qualification score (e.g., 5 out of 10; or its RSSI value), its level (in this case level one) and the unique ID of its parent (in this case the collector's ID).

If the qualification threshold is met or exceeded, the collector 116 registers the node. Registering a meter 114 comprises updating a list of the registered nodes at collector 116. For example, the list may be updated to identify the meter's system-wide unique identifier and the communication path to the node. Collector 116 also records the meter's level in the subnet (i.e. whether the meter is a level one node, level two node, etc.), whether the node operates as a repeater, and if so, the number of meters for which it operates as a repeater. The registration process further comprises transmitting registration information to the meter 114. For example, collector 116 forwards to meter 114 an indication that it is registered, the unique identifier of the collector with which it is registered, the level the meter exists at in the subnet, and the unique identifier of its parent meter that will serve as a repeater for messages the meter may send to the collector. In the case of a level one node, the parent is the collector itself. The meter stores this data and begins to operate as part of the subnet by responding to commands from its collector 116.

Qualification and registration continues for each meter that responds to the collector's initial Node Scan Procedure request. The collector 116 may rebroadcast the Node Scan Procedure additional times so as to insure that all meters 114 that may receive the Node Scan Procedure have an opportunity for their response to be received and the meter qualified as a level one node at collector 116.

The node scan process then continues by performing a similar process as that described above at each of the now registered level one nodes. This process results in the identification and registration of level two nodes. After the level two nodes are identified, a similar node scan process is performed at the level two nodes to identify level three nodes, and so on.

Specifically, to identify and register meters that will become level two meters, for each level one meter, in succession, the collector 116 transmits a command to the level one meter, which may be referred to as an "Initiate Node Scan Procedure" command. This command instructs the level one meter to perform its own node scan process. The request comprises several data items that the receiving meter may use in completing the node scan. For example, the request may comprise the number of timeslots available for responding nodes, the unique address of the collector that initiated the request, and a measure of the reliability of the communications between the target node and the collector. As described below, the measure of reliability may be employed during a process for identifying more reliable paths for previously registered nodes.

The meter that receives the Initiate Node Scan Response request responds by performing a node scan process similar to that described above. More specifically, the meter broadcasts a request to which all unregistered nodes may respond. The request comprises the number of timeslots available for responding nodes (which is used to set the period for the node to wait for responses), the unique address of the collector that initiated the node scan procedure, a measure of the reliability of the communications between the sending node and the collector (which may be used in the process of determining whether a meter's path may be switched as described below), the level within the subnet of the node sending the request, and an RSSI threshold (which may also be used in the process of determining whether a registered meter's path may be switched). The meter issuing the node scan request then waits for and receives responses from unregistered nodes. For each response, the meter stores in memory the unique identifier of the responding meter. This information is then transmitted to the collector.

For each unregistered meter that responded to the node scan issued by the level one meter, the collector attempts again to determine the reliability of the communication path to that meter. In one embodiment, the collector sends a "Qualify Nodes Procedure" command to the level one node which instructs the level one node to transmit a predetermined number of additional packets to the potential level two node and to record the number of acknowledgements received back from the potential level two node. This qualification score (e.g., 8 out of 10) is then transmitted back to the collector, which again compares the score to a qualification threshold. In other embodiments, other measures of the communications reliability may be provided, such as an RSSI value.

If the qualification threshold is not met, then the collector adds an entry for the node in the Straggler Table, as discussed above. However, if there already is an entry in the Straggler Table for the node, the collector will update that entry only if the qualification score for this node scan procedure is better than the recorded qualification score from the prior node scan that resulted in an entry for the node.

If the qualification threshold is met or exceeded, the collector 116 registers the node. Again, registering a meter 114 at level two comprises updating a list of the registered nodes at collector 116. For example, the list may be updated to identify the meter's unique identifier and the level of the meter in the subnet. Additionally, the collector's 116 registration information is updated to reflect that the meter 114 from which the scan process was initiated is identified as a repeater (or parent) for the newly registered node. The registration process further comprises transmitting information to the newly registered meter as well as the meter that will serve as a repeater for the newly added node. For example, the node that issued the node scan response request is updated to identify that it operates as a repeater and, if it was previously registered as a repeater, increments a data item identifying the number of nodes for which it serves as a repeater. Thereafter, collector 116 forwards to the newly registered meter an indication that it is registered, an identification of the collector 116 with which it is registered, the level the meter exists at in the subnet, and the unique identifier of the node that will serve as its parent, or repeater, when it communicates with the collector 116.

The collector then performs the same qualification procedure for each other potential level two node that responded to the level one node's node scan request. Once that process is completed for the first level one node, the collector initiates the same procedure at each other level one node until the process of qualifying and registering level two nodes has been completed at each level one node. Once the node scan procedure has been performed by each level one node, resulting in a number of level two nodes being registered with the collector, the collector will then send the Initiate Node Scan Response command to each level two node, in turn. Each level two node will then perform the same node scan procedure as performed by the level one nodes, potentially resulting in the registration of a number of level three nodes. The process is then performed at each successive node, until a maximum number of levels is reached (e.g., seven levels) or no unregistered nodes are left in the subnet.

It will be appreciated that in the present embodiment, during the qualification process for a given node at a given level, the collector qualifies the last "hop" only. For example, if an unregistered node responds to a node scan request from a level four node, and therefore, becomes a potential level five node, the qualification score for that node is based on the reliability of communications between the level four node and the potential level five node (i.e., packets transmitted by the level four node versus acknowledgments received from the potential level five node), not based on any measure of the reliability of the communications over the full path from the collector to the potential level five node. In other embodiments, of course, the qualification score could be based on the full communication path.

At some point, each meter will have an established communication path to the collector which will be either a direct path (i.e., level one nodes) or an indirect path through one or more intermediate nodes that serve as repeaters. If during operation of the network, a meter registered in this manner fails to perform adequately, it may be assigned a different path or possibly to a different collector as described below.

As previously mentioned, a full node scan may be performed when a collector 116 is first introduced to a network. At the conclusion of the full node scan, a collector 116 will have registered a set of meters 114 with which it communicates and reads metering data. Full node scans might be periodically performed by an installed collector to identify new meters 114 that have been brought on-line since the last node scan and to allow registered meters to switch to a different path.

In addition to the full node scan, collector 116 may also perform a process of scanning specific meters 114 in the subnet 120, which is referred to as a "node scan retry." For example, collector 116 may issue a specific request to a meter 114 to perform a node scan outside of a full node scan when on a previous attempt to scan the node, the collector 116 was unable to confirm that the particular meter 114 received the node scan request. Also, a collector 116 may request a node scan retry of a meter 114 when during the course of a full node scan the collector 116 was unable to read the node scan data from the meter 114. Similarly, a node scan retry will be performed when an exception procedure requesting an immediate node scan is received from a meter 114.

The system 110 also automatically reconfigures to accommodate a new meter 114 that may be added. More particularly, the system identifies that the new meter has begun operating and identifies a path to a collector 116 that will become responsible for collecting the metering data. Specifically, the new meter will broadcast an indication that it is unregistered. In one embodiment, this broadcast might be, for example, embedded in, or relayed as part of a request for an update of the real time as described above. The broadcast will be received at one of the registered meters 114 in proximity to the meter that is attempting to register. The registered meter 114 forwards the time to the meter that is attempting to register. The registered node also transmits an exception request to its collector 116 requesting that the collector 116 implement a node scan, which presumably will locate and register the new meter. The collector 116 then transmits a request that the registered node perform a node scan. The registered node will perform the node scan, during which it requests that all unregistered nodes respond. Presumably, the newly added, unregistered meter will respond to the node scan. When it does, the collector will then attempt to qualify and then register the new node in the same manner as described above.

Once a communication path between the collector and a meter is established, the meter can begin transmitting its meter data to the collector and the collector can transmit data and instructions to the meter. As mentioned above, data is transmitted in packets. "Outbound" packets are packets transmitted from the collector to a meter at a given level. In one embodiment, outbound packets contain the following fields, but other fields may also be included:

Length—the length of the packet;
SrcAddr—source address—in this case, the ID of the collector;
DestAddr—the LAN ID of the meter to which the packet addressed;

RptPath—the communication path to the destination meter (i.e., the list of identifiers of each repeater in the path from the collector to the destination node); and Data—the payload of the packet.

The packet may also include integrity check information (e.g., CRC), a pad to fill-out unused portions of the packet and other control information. When the packet is transmitted from the collector, it will only be forwarded on to the destination meter by those repeater meters whose identifiers appear in the RptPath field. Other meters that may receive the packet, but that are not listed in the path identified in the RptPath field will not repeat the packet.

"Inbound" packets are packets transmitted from a meter at a given level to the collector. In one embodiment, inbound packets contain the following fields, but other fields may also be included:

Length—the length of the packet;

SrcAddr—source address—the address of the meter that initiated the packet;

DestAddr—the ID of the collector to which the packet is to be transmitted;

RptAddr—the ID of the parent node that serves as the next repeater for the sending node;

Data—the payload of the packet;

Because each meter knows the identifier of its parent node (i.e., the node in the next lower level that serves as a repeater for the present node), an inbound packet need only identify who is the next parent. When a node receives an inbound packet, it checks to see if the RptAddr matches its own identifier. If not, it discards the packet. If so, it knows that it is supposed to forward the packet on toward the collector. The node will then replace the RptAddr field with the identifier of its own parent and will then transmit the packet so that its parent will receive it. This process will continue through each repeater at each successive level until the packet reaches the collector.

For example, suppose a meter at level three initiates transmission of a packet destined for its collector. The level three node will insert in the RptAddr field of the inbound packet the identifier of the level two node that serves as a repeater for the level three node. The level three node will then transmit the packet. Several level two nodes may receive the packet, but only the level two node having an identifier that matches the identifier in the RptAddr field of the packet will acknowledge it. The other will discard it. When the level two node with the matching identifier receives the packet, it will replace the RptAddr field of the packet with the identifier of the level one packet that serves as a repeater for that level two packet, and the level two packet will then transmit the packet. This time, the level one node having the identifier that matches the RptAddr field will receive the packet. The level one node will insert the identifier of the collector in the RptAddr field and will transmit the packet. The collector will then receive the packet to complete the transmission.

A collector 116 periodically retrieves meter data from the meters that are registered with it. For example, meter data may be retrieved from a meter every 4 hours. Where there is a problem with reading the meter data on the regularly scheduled interval, the collector will try to read the data again before the next regularly scheduled interval. Nevertheless, there may be instances wherein the collector 116 is unable to read metering data from a particular meter 114 for a prolonged period of time. The meters 114 store an indication of when they are read by their collector 116 and keep track of the time since their data has last been collected by the collector 116. If the length of time since the last reading exceeds a defined threshold, such as for example, 18 hours, presumably a problem has arisen in the communication path between the particular meter 114 and the collector 116. Accordingly, the meter 114 changes its status to that of an unregistered meter and attempts to locate a new path to a collector 116 via the process described above for a new node. Thus, the exemplary system is operable to reconfigure itself to address inadequacies in the system.

In some instances, while a collector 116 may be able to retrieve data from a registered meter 114 occasionally, the level of success in reading the meter may be inadequate. For example, if a collector 116 attempts to read meter data from a meter 114 every 4 hours but is able to read the data, for example, only 70 percent of the time or less, it may be desirable to find a more reliable path for reading the data from that particular meter. Where the frequency of reading data from a meter 114 falls below a desired success level, the collector 116 transmits a message to the meter 114 to respond to node scans going forward. The meter 114 remains registered but will respond to node scans in the same manner as an unregistered node as described above. In other embodiments, all registered meters may be permitted to respond to node scans, but a meter will only respond to a node scan if the path to the collector through the meter that issued the node scan is shorter (i.e., less hops) than the meter's current path to the collector. A lesser number of hops is assumed to provide a more reliable communication path than a longer path. A node scan request always identifies the level of the node that transmits the request, and using that information, an already registered node that is permitted to respond to node scans can determine if a potential new path to the collector through the node that issued the node scan is shorter than the node's current path to the collector.

If an already registered meter 114 responds to a node scan procedure, the collector 116 recognizes the response as originating from a registered meter but that by re-registering the meter with the node that issued the node scan, the collector may be able to switch the meter to a new, more reliable path. The collector 116 may verify that the RSSI value of the node scan response exceeds an established threshold. If it does not, the potential new path will be rejected. However, if the RSSI threshold is met, the collector 116 will request that the node that issued the node scan perform the qualification process described above (i.e., send a predetermined number of packets to the node and count the number of acknowledgements received). If the resulting qualification score satisfies a threshold, then the collector will register the node with the new path. The registration process comprises updating the collector 116 and meter 114 with data identifying the new repeater (i.e. the node that issued the node scan) with which the updated node will now communicate. Additionally, if the repeater has not previously performed the operation of a repeater, the repeater would need to be updated to identify that it is a repeater. Likewise, the repeater with which the meter previously communicated is updated to identify that it is no longer a repeater for the particular meter 114. In other embodiments, the threshold determination with respect to the RSSI value may be omitted. In such embodiments, only the qualification of the last "hop" (i.e., sending a predetermined number of packets to the node and counting the number of acknowledgements received) will be performed to determine whether to accept or reject the new path.

In some instances, a more reliable communication path for a meter may exist through a collector other than that with which the meter is registered. A meter may automatically recognize the existence of the more reliable communication path, switch collectors, and notify the previous collector that the change has taken place. The process of switching the registration of a meter from a first collector to a second collector begins when a registered meter 114 receives a node scan request from a collector 116 other than the one with which the meter is presently registered. Typically, a registered meter 114 does not respond to node scan requests. However, if the request is likely to result in a more reliable transmission path, even a registered meter may respond. Accordingly, the meter determines if the new collector offers a potentially more reliable transmission path. For example, the meter 114 may determine if the path to the potential new collector 116 comprises fewer hops than the path to the collector with which the meter is registered. If not, the path may not be more reliable and the meter 114 will not respond to the node scan. The meter 114 might also determine if the RSSI of the node scan packet exceeds an RSSI threshold identified in the node scan information. If so, the new collector may offer a more reliable transmission path for meter data. If not, the transmission path may not be acceptable and the meter may not respond. Additionally, if the reliability of communication between the potential new collector and the repeater that would service the meter meets a threshold established when the repeater was registered with its existing collector, the communication path to the new collector may be more reliable. If the reliability does not exceed this threshold, however, the meter 114 does not respond to the node scan.

If it is determined that the path to the new collector may be better than the path to its existing collector, the meter 114 responds to the node scan. Included in the response is information regarding any nodes for which the particular meter may operate as a repeater. For example, the response might identify the number of nodes for which the meter serves as a repeater.

The collector 116 then determines if it has the capacity to service the meter and any meters for which it operates as a repeater. If not, the collector 116 does not respond to the meter that is attempting to change collectors. If, however, the collector 116 determines that it has capacity to service the meter 114, the collector 116 stores registration information about the meter 114. The collector 116 then transmits a registration command to meter 114. The meter 114 updates its registration data to identify that it is now registered with the new collector. The collector 116 then communicates instructions to the meter 114 to initiate a node scan request. Nodes that are unregistered, or that had previously used meter 114 as a repeater respond to the request to identify themselves to collector 116. The collector registers these nodes as is described above in connection with registering new meters/nodes.

Under some circumstances it may be necessary to change a collector. For example, a collector may be malfunctioning and need to be taken off-line. Accordingly, a new communication path must be provided for collecting meter data from the meters serviced by the particular collector. The process of replacing a collector is performed by broadcasting a message to unregister, usually from a replacement collector, to all of the meters that are registered with the collector that is being removed from service. In one embodiment, registered meters may be programmed to only respond to commands from the collector with which they are registered. Accordingly, the command to unregister may comprise the unique identifier of the collector that is being replaced. In response to the command to unregister, the meters begin to operate as unregistered meters and respond to node scan requests. To allow the unregistered command to propagate through the subnet, when a node receives the command it will not unregister immediately, but rather remain registered for a defined period, which may be referred to as the "Time to Live". During this time to live period, the nodes continue to respond to application layer and immediate retries allowing the unregistration command to propagate to all nodes in the subnet. Ultimately, the meters register with the replacement collector using the procedure described above.

One of collector's 116 main responsibilities within subnet 120 is to retrieve metering data from meters 114. In one embodiment, collector 116 has as a goal to obtain at least one successful read of the metering data per day from each node in its subnet. Collector 116 attempts to retrieve the data from all nodes in its subnet 120 at a configurable periodicity. For example, collector 116 may be configured to attempt to retrieve metering data from meters 114 in its subnet 120 once every 4 hours. In greater detail, in one embodiment, the data collection process begins with the collector 116 identifying one of the meters 114 in its subnet 120. For example, collector 116 may review a list of registered nodes and identify one for reading. The collector 116 then communicates a command to the particular meter 114 that it forward its metering data to the collector 116. If the meter reading is successful and the data is received at collector 116, the collector 116 determines if there are other meters that have not been read during the present reading session. If so, processing continues. However, if all of the meters 114 in subnet 120 have been read, the collector waits a defined length of time, such as, for example, 4 hours, before attempting another read.

If during a read of a particular meter, the meter data is not received at collector 116, the collector 116 begins a retry procedure wherein it attempts to retry the data read from the particular meter. Collector 116 continues to attempt to read the data from the node until either the data is read or the next subnet reading takes place. In an embodiment, collector 116 attempts to read the data every 60 minutes. Thus, wherein a subnet reading is taken every 4 hours, collector 116 may issue three retries between subnet readings.

Figure 4:
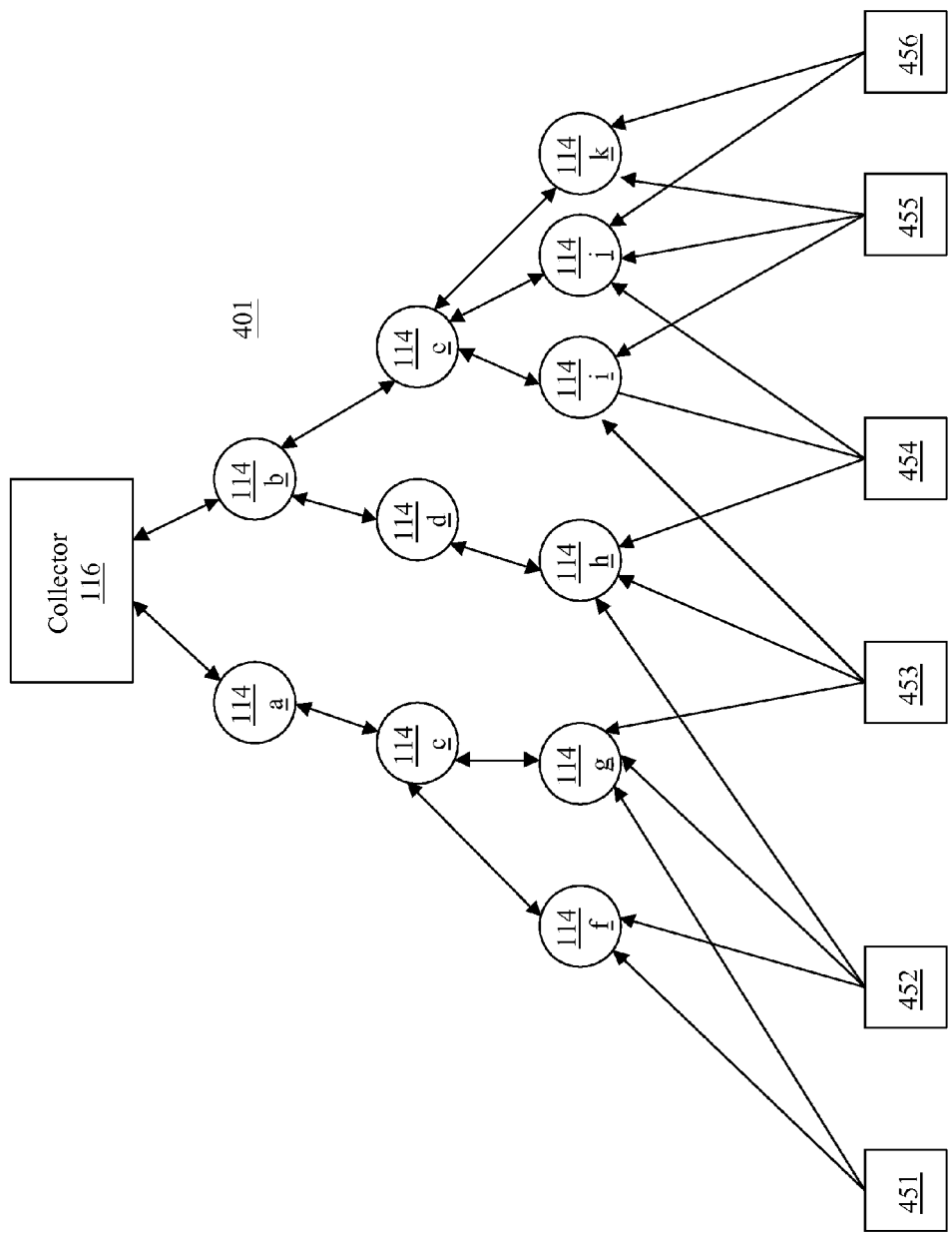
FIG. 4 is a diagram of an exemplary subnet of a wireless network for collecting data from remote devices.

Meters 114 are often two-way meters—i.e. they are operable to both receive and transmit data. However, one-way meters that are operable only to transmit and not receive data may also be deployed. FIG. 4 is a block diagram illustrating a subnet 401 that includes a number of one-way meters 451-456. As shown, meters 114a-k are two-way devices. In this example, the two-way meters 114a-k operate in the exemplary manner described above, such that each meter has a communication path to the collector 116 that is either a direct path (e.g., meters 114a and 114b have a direct path to the collector 116) or an indirect path through one or more intermediate meters that serve as repeaters. For example, meter 114h has a path to the collector through, in sequence, intermediate meters 114d and 114b. In this example embodiment, when a one-way meter (e.g., meter 451) broadcasts its usage data, the data may be received at one or more two-way meters that are in proximity to the one-way meter (e.g., two-way meters 114f and 114g). In one embodiment, the data from the one-way meter is stored in each two-way meter that receives it, and the data is designated in those two-way meters as having been received from the one-way meter. At some point, the data from the one-way meter is communicated, by each two-way meter that received it, to the collector 116. For example, when the collector reads the two-way meter data, it recognizes the existence of meter data from the one-way meter and reads it as well. After the data from the one-way meter has been read, it is removed from memory.

While the collection of data from one-way meters by the collector has been described above in the context of a network of two-way meters 114 that operate in the manner described in connection with the embodiments described above, it is understood that the present invention is not limited to the particular form of network established and utilized by the meters 114 to transmit data to the collector. Rather, the present invention may be used in the context of any network topology in which a plurality of two-way communication nodes are capable of transmitting data and of having that data propagated through the network of nodes to the collector.

According to some of the disclosed embodiments, an improved antenna configuration may be included in an electricity meter. An electricity meter may include, for example, a radio, a first printed circuit board element, a second printed circuit board element and a flexible printed circuit element. The first printed circuit board element may be, for example, a main printed circuit board to which one or more electrical components are attached. Such electrical components may generate noise that interferes with radio communications. The flexible printed circuit element may include at least a portion of an antenna element that is connected to the radio through an electrical connection path. In some cases, the flexible printed circuit element may be configured to conform to a shape of a portion of a meter housing such as a round or circular shape.

In some cases, at least a portion of the second printed circuit board element may be positioned between the first printed circuit board element and the flexible printed circuit element. The second printed circuit board element may, for example, be positioned such that it is non-parallel and, in some cases, orthogonal with respect to the first printed circuit board element. In some cases, the second printed circuit board element may serve to shield the antenna element on the flexible printed circuit element from noise generated by electrical components on the first printed circuit board element. In some cases, the electrical connection path between the antenna element and the radio may be configured such that it does not include any coaxial cabling.

Figure 5:
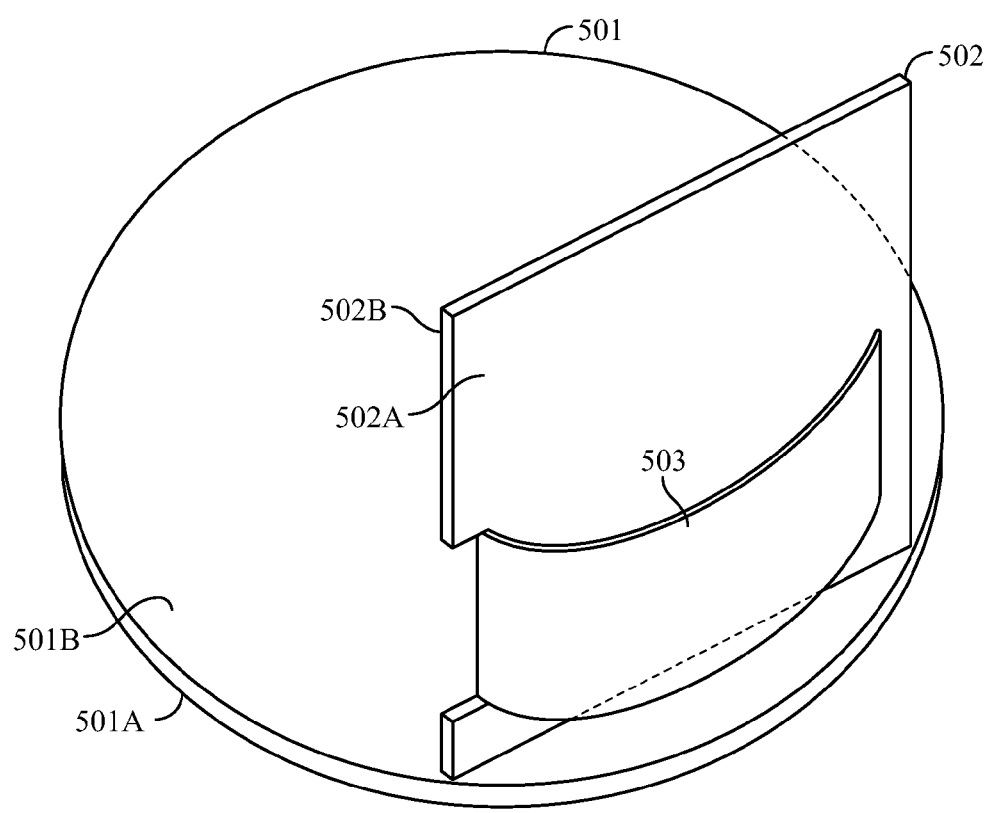
FIG. 5 is a diagram of an example electricity meter printed circuit board configuration.

An example electricity meter printed circuit board configuration is depicted in FIG. 5. The example configuration includes a first printed circuit board element 501, a second printed circuit board element 502 and a flexible printed circuit element 503. The first printed circuit board element 501 includes an outward facing side 501A and an inward facing side 501A, while the second printed circuit board element 502 includes an outward facing side 502A and an inward facing side 502B. The first printed circuit board element 501 and the second printed circuit board element 502 are positioned such that they are at an angle with respect to one another and are non-parallel with respect to one another. In particular, a largest flat surface (i.e., side 501A or 501B) of the first printed circuit board element 501 is positioned such that it is at an angle and is non-parallel with respect to a largest flat surface (i.e., side 502A or 502B) of the second printed circuit board element 502. Furthermore, in the particular example of FIG. 5, a largest flat surface (i.e., side 501A or 501B) of the first printed circuit board element 501 is positioned such that it is orthogonal with respect to a largest flat surface (i.e., side 502A or 502B) of the second printed circuit board element 502. However, it is not required that elements 501 and 502 be positioned such that they are orthogonal.

First and second printed circuit board elements 501 and 502 and flexible circuit element 503 may, for example, connect components using conductive tracks and may also, for example, include one or more sheets of a conductive material, such as copper, laminated onto a non-conductive material. First and second printed circuit board elements 501 and 502 may be more rigid (i.e., less flexible) than flexible printed circuit element 503. Flexible printed circuit element 503 may include, for example, a more flexible non-conductive material such as polyimide. First and second printed circuit board elements 501 and 502 may include, for example, a more rigid (i.e., less flexible) non-conductive material such as FR-4. As will be described in detail below, in some cases, a portion of flexible printed circuit element 503 may be laminated onto or otherwise attached or connected to second printed circuit board element 502. Also, in some cases, flexible printed circuit element 503 may include extensions of one or more layers of material that are also included in second printed circuit board element 502. It is not required, however, that flexible printed circuit element 503 be laminated onto and/or include an extension of portions of second printed circuit board element 502.

Figure 6:
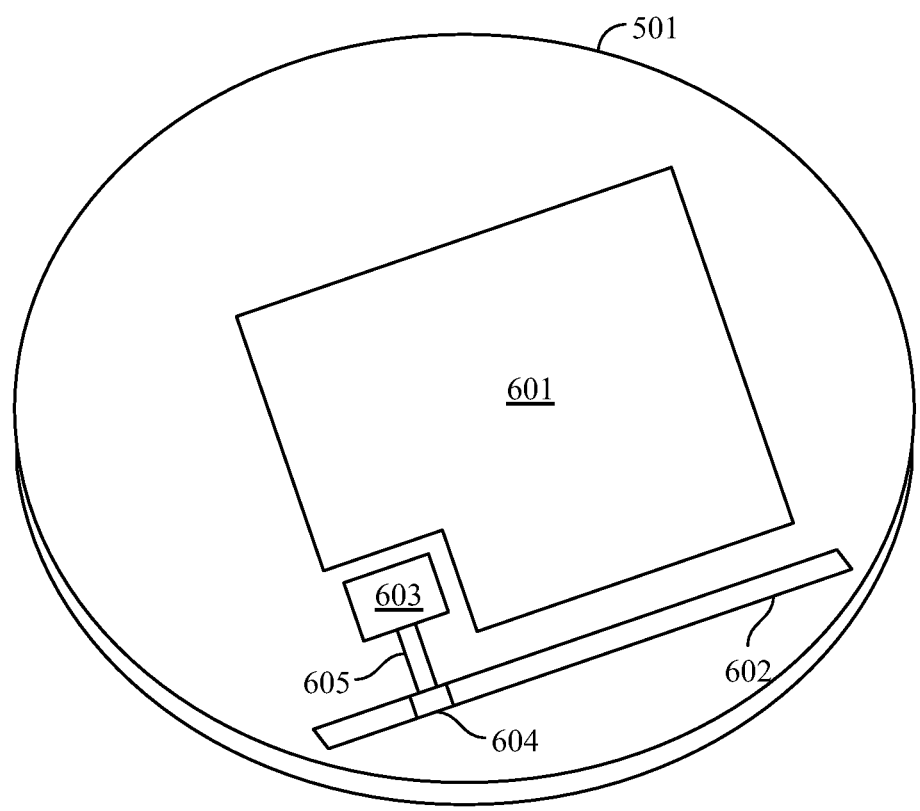
FIG. 6 is a diagram of an example first printed circuit board element.

An example first printed circuit board element 501 is depicted in FIG. 6. The first printed circuit board element 501 may be, for example, a main printed circuit board for an electricity meter. The first printed circuit board element 501 is attached to one or more electrical components 601. The electrical components 601 may include, for example, one or more components associated with metering electrical energy delivered from a voltage source to an electrical load. The electrical components 601 may include, for example, components associated with measuring currents and/or voltages, components associated with switching and various processing components. The electrical components 601 may include, for example, components such as capacitors, resistors, direct current (DC) power supplies, integrated circuits and other electrical components.

First printed circuit board element 501 also includes a radio 603, which communicates with one or more external devices by, for example, transmitting and receiving radio signals using techniques such as the examples set forth above. As should be appreciated, the particular location of radio 603 is merely an example location, and the radio 603 may be positioned at other locations. For example, in some cases, radio 603 may be positioned on the second printed circuit board element 502. It is also noted that a radio may include multiple different sub-components that may be spread across one or more different locations. For example, in some cases, one or more sub-components of the radio may be positioned on the first printed circuit board element 501 and one or more other sub-components of the radio may be positioned on the second printed circuit board element 502. As will be described in detail below, radio 603 is connected to an antenna component that is at least partially included on the flexible circuit element 503.

Area 602 is an area of the first printed circuit board element 501 that is covered by the second printed circuit board element 502 as shown, for example, in FIG. 5. First printed circuit board element 501 has an attached first board radio frequency (RF) Connector 604, which is a board-to-board connector that enables radio signals to be communicated between first printed circuit board element 501 and second printed circuit board element 502. A corresponding second board RF connector (e.g., element 904 of FIGS. 7 and 9) may be attached to the second printed circuit board element 502 for engaging with the first board RF connector 604. In some cases, however, the first printed circuit board element 501 and the second printed circuit board element 502 may be connected using only a single connector or using more than two connectors. First board RF connector 604 may, in some cases, serve as the primary RF port of the radio 603.

Transmission line 605 connects radio 603 with connector 604. Transmission line 605 may be, for example, 50 ohm transmission line and may also be, for example, a coplanar microstrip. As described in detail below, another transmission line may also be included on the second printed circuit board 502 to assist in connecting radio 603 to its respective antenna element.

Figure 7:
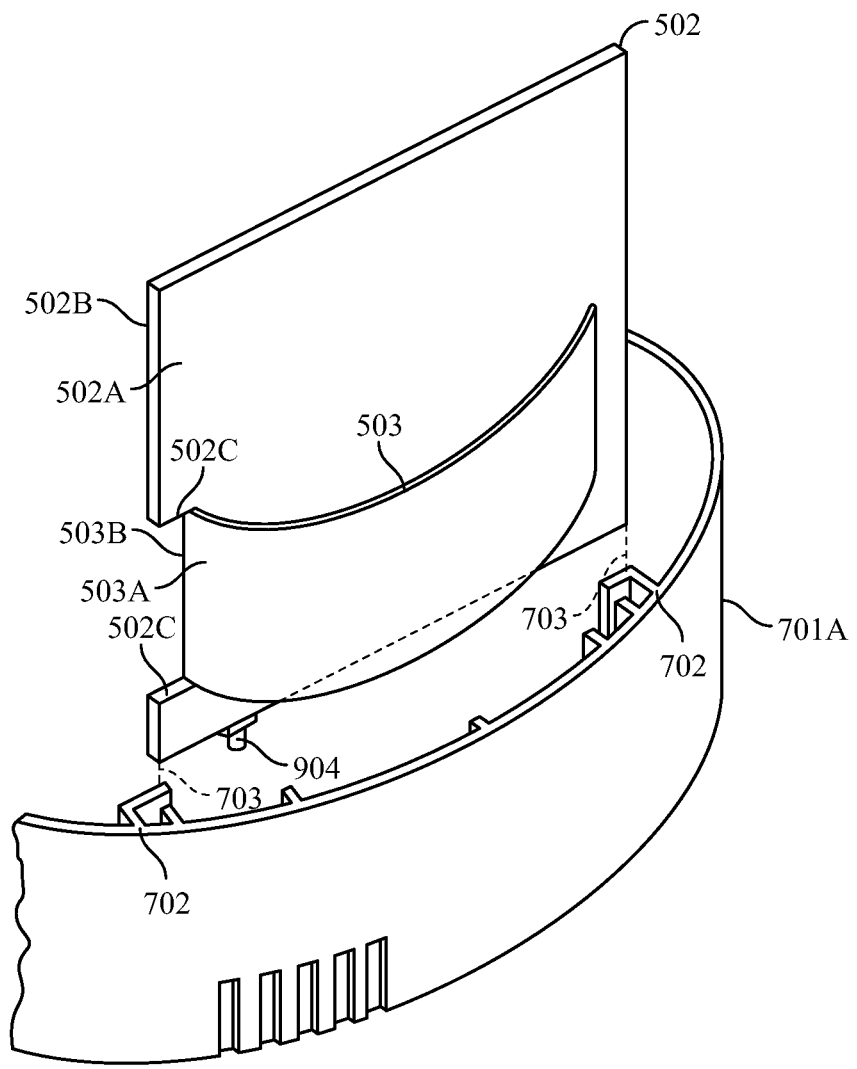
FIG. 7 is a diagram of an example installation of second printed circuit board element.

An example installation of second printed circuit board element 502 in accordance with the present disclosure is depicted in FIG. 7. As shown in FIG. 7, meter side housing 701A includes guide slots 702, which are slots into which the second printed circuit board element 502 may be inserted. Meter side housing 701A is a side portion of a meter housing. In some cases, no guides, only a single guide or more than two guides may be used. Guide lines 703 indicate a path along which the second printed circuit board element 502 may be inserted downward into the guide slots 702. Second printed circuit board element 502 has an attached second board radio frequency (RF) connector 904. As set forth above, second board RF connector 904 may engage first board RF connector 604 of FIG. 6 to provide a board-to-board RF connection between second printed circuit board element 502 and first printed circuit board element 501. As set forth above, first board RF connector 604 may, in some cases, serve as the primary RF port of the radio 603. Utilization of the board-to-board connectors 604 and 904 may, in some cases, eliminate any need for expensive and unwieldy cabling for connection of an antenna to a radio.

Figure 8:
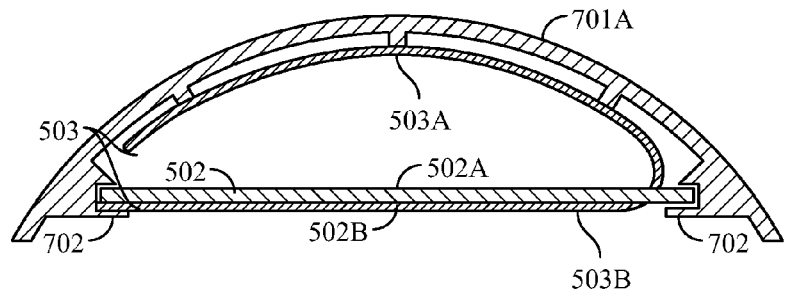
FIG. 8 is a diagram of an example flexible printed circuit element configuration.

An example flexible printed circuit element configuration is depicted in FIG. 8. As shown in FIG. 8, flexible printed circuit element 503 includes a straight portion 503B, which is laminated onto an inward facing side 502B of the second printed circuit board element 502. Flexible printed circuit element 503 is folded such that it crosses second printed circuit board element 502 to extend along both inward facing side 502B and outward facing side 502A. Flexible printed circuit element 503 also includes an arc portion 503A, which generally conforms to the round shape of the meter side housing 701A.

Referring back to FIG. 7, it is shown that second printed circuit board element 502 includes an indentation 502C, which allows flexible printed circuit element 503 to transition across the second printed circuit board element 502 between sides 502A and 502B without interfering with the guide slots 702 or otherwise interfering with the meter side housing 701A. In some cases, the flexible printed circuit element 503 may, for example, be folded around and held to help allow the second printed circuit board element 502 to be inserted into the guide slots 702. Also, in some cases, once the arc portion 503A of flexible printed circuit element 503 is released, it may tend to move outward and generally conform to the radius of the meter side housing 701A.

It is noted that there is no requirement that flexible printed circuit element 503 transition across opposite sides 502A and B of second printed circuit board element 502. For example, in some cases, the flexible printed circuit element 503 may be positioned entirely outward from the second printed circuit board element 502. However, allowing flexible printed circuit element 503 to transition across opposite sides 502A and B of second printed circuit board element 502 may, in some cases, be beneficial by avoiding a minimum bend radius of the flexible printed circuit element 503. It is further noted that there is no requirement that any portion of flexible printed circuit element 503 be laminated to the second printed circuit board element 502. Additionally, there is no requirement that all, or any portion, of the flexible circuit element 503 be positioned such that it has, or conforms to, any particular shape or shapes. Furthermore, it is noted that the size of the flexible printed circuit element 503 may be adjusted to, for example, allow larger and more efficient antenna elements and the location of the flexible printed circuit element 503 may be adjusted to, for example, place the antenna closer to or farther from the face of the meter.

Accordingly, based on FIGS. 5-8, it should be apparent that arc portion 503A of flexible circuit element 503 may be positioned outward from the second printed circuit board 502 and adjacent to the meter side housing 701A. It should also be apparent that electrical components 601 on the first printed circuit board element 501 may be positioned inward from the second printed circuit board element. Thus, in some cases, at least a portion of the second printed circuit board element 502 may be positioned between the electrical components 601 and the arc portion 503A of the flexible circuit element 503. For example, in some cases, a shortest straight line distance between one or more of the electrical components 601 and the arc portion 503A of the flexible circuit element 503 may pass through the second printed circuit board element 502. It should be appreciated that this configuration may, in some cases, allow the second printed circuit board element 502 to at least partially shield the arc portion 503A of flexible circuit element 503 (and, therefore, any portion of the antenna element that is included on the arc portion 503A) from noise and other interference generated by the electrical components 601. This positioning may, for example, shield the antenna element from noise generated by the electrical components 601. This may reduce an extent to which the electrical components 601 interfere with the communications of antenna element 905. In some cases, at least a portion of the antenna element may be positioned on the arc portion 503A of flexible circuit element 503.

It is further noted that the angular position of the second printed circuit board element 502 with respect to the second first printed circuit board element 501 may also assist to shield at least portions of the antenna element from noise generated by the electrical components 601. In particular, the second printed circuit board element 502 may be positioned such that it is non-parallel and, in some cases, orthogonal with respect to the second first printed circuit board element 501. This non-parallel configuration may, in some cases, allow the second printed circuit board element 502 to at least partially shield the arc portion 503A of flexible circuit element 503 (and, therefore, any portion of the antenna element that is included on the arc portion 503A) from noise and other interference generated by the electrical components 601.

Figure 9:
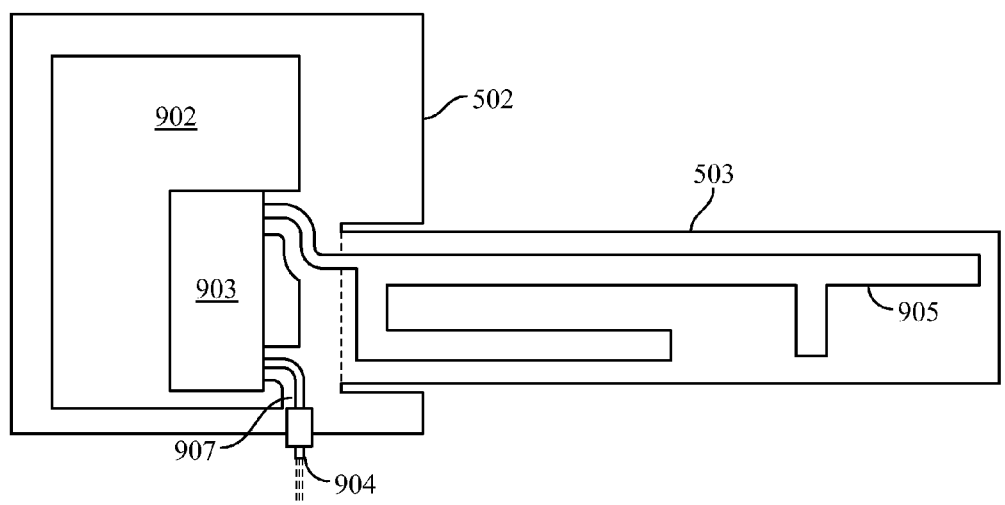
FIG. 9 is a diagram of an example antenna element configuration.

An example antenna element configuration is depicted in FIG. 9. As shown, the majority of the antenna element 905 is included within flexible printed circuit element 503. However, a small portion of antenna element 905 is included within second printed circuit board element 502. There is no requirement, however, that any portion of the antenna element 905 be included within second printed circuit board element 502. As mentioned above, in some cases, at least a portion of the antenna element 905 may be positioned on the arc portion 503A of flexible circuit element 503. Antenna element 905 may assist in providing radio communications capability for the radio 603. In the particular example of FIG. 9, the antenna element 905 is a planar element, such as a copper element, that is printed onto the flexible circuit element 503. However, in some cases, the antenna element may not be printed onto the flexible circuit element 503. For example, an antenna element may be included in flexible circuit element 503 by being soldered or otherwise attached to the flexible circuit element 503.

The antenna element 905 connects to a filter 903, which filters out frequencies that are not associated with the radio 603 for which the antenna element 905 provides reception. Filter 903 is connected to second board radio frequency (RF) connector 904 on the bottom edge of the second printed circuit board element 502. As set forth above, second board RF connector 904 may engage first board RF connector 604 of FIG. 6 to provide a board-to-board RF connection between second printed circuit board element 502 and first printed circuit board element 501.

Transmission line 907 connects second board RF connector 904 to filter 903. As should be appreciated, filter 903 is an optional element and, in some cases, transmission line 907 may connect antenna element 905 directly to second board RF connector 904. Transmission line 907 may be, for example, a 50 ohm transmission line and may also be, for example, a coplanar microstrip. As set forth above, a transmission line 605 may also be included on the first printed circuit board 501 to connect the radio 603 to the first board RF connector 604 as shown in FIG. 6. Accordingly, it should be appreciated that transmission line 605, first board RF connector 604, second board RF connector 904, transmission line 907 and filter 903 may combine to form an example electrical connection path for transmission of radio signals between radio 603 and antenna component 905. It should also be appreciated that this is merely an example configuration and that additional or fewer elements may be included within an electrical connection path between the radio 603 and antenna component 905.

Second printed circuit board element 502 also includes a ground plane 902. The antenna element 905 may, in some cases, become properly tuned when the flexible printed circuit element 503 is folded back over the ground plane 902 on the second printed circuit board element 502. Ground plane 902 may be, for example, a printed ground plane element. Ground plane 902 may, for example, be located on the inward facing side 502B of the second printed circuit board element 502. As another example, ground plane 902 may be located on the outward facing side 502A of the second printed circuit board element 502. In some cases, a ground plane may be included on both the inward facing side 502B and the outward facing side 502A of the second printed circuit board element 502.

Ground plane 902 may, in some cases, provide increased isolation from noise generated by electrical components 601 on the first printed circuit board element 501. Ground plane 902 may also, in some cases, reduce sensitivity of the antenna element 905 to the location of electrical components 601 on the first printed circuit board element 501. In some cases, to provide increased shielding for the antenna element 905, the size of ground plane 902 may be increased such that it occupies a substantial portion of the second printed circuit board element 502. For example, in some cases, ground plane 902 may occupy approximately 25% to 90% of one or both sides 502A and/or 502B of the second printed circuit board element 502.

The second printed circuit board element 502 may also, for example, include matching elements to assist with impedance matching with respect to the antenna element 905. Such matching elements may include, for example, lumped elements such as capacitors and inductors. Such matching elements may also include, for example, distributed elements such as patterns.

In some cases, flexible circuit element 503 may include multiple antennas connected to one or more different radios in the electricity meter. In these and other cases, multiple transmission lines, multiple filters and multiple RF connectors may sometimes be included on the second printed circuit board 502 and/or the flexible circuit element 503. In addition, the size of the second printed circuit board element 502 and/or the flexible circuit element 503 may optionally be increased to accommodate the multiple antenna elements.

Figure 10:
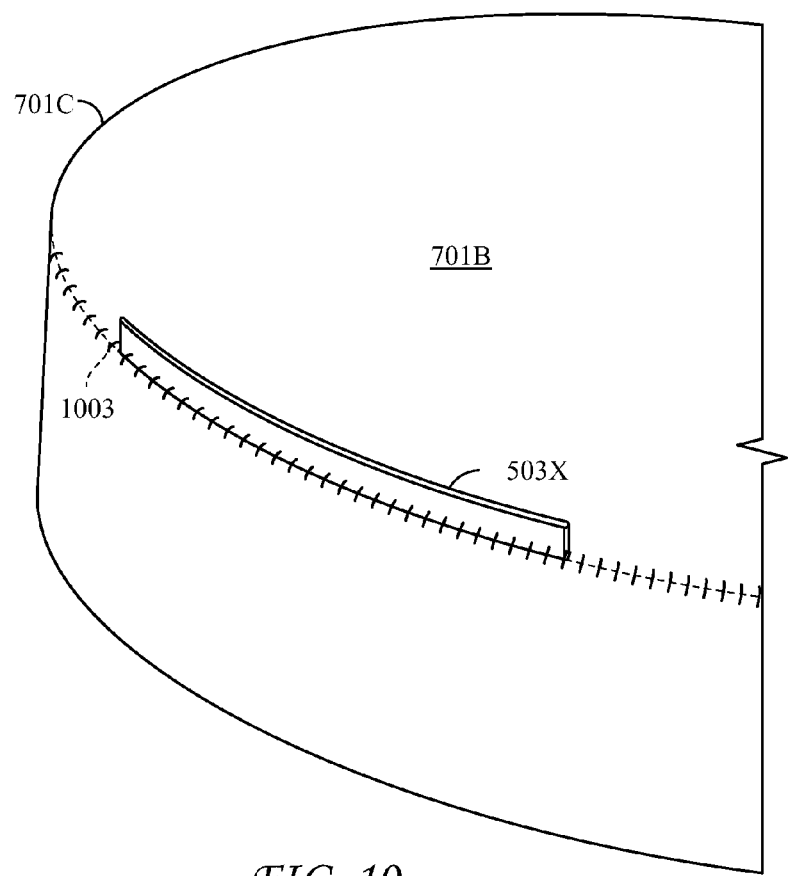
FIG. 10 depicts an example electricity meter with an extended flexible printed circuit element.

First printed circuit board element 501, second printed circuit board element 502 and flexible circuit element 503 may, for example, be positioned inside the meter housing. As another example, a portion of flexible circuit element 503 may, in some cases, extend outward from the meter housing. FIG. 10 depicts an example electricity meter with an extended flexible printed circuit element. Meter top housing 701B is a top portion of a meter housing. Meter top housing 701B includes a slot 1003 along its rim 701C that allows an extension area 503X of the flexible printed circuit element 503 to extend outward from the top housing 701B of the meter. It is understood that extension area 503X may, in some cases, include at least a portion of antenna element 905 such that at least a portion of the antenna element 905 extends outward from the top housing 701B of the meter. It is noted that the inclusion of extension area 503X may, in some cases, allow the antenna element 905 to at least partially extend outward from the meter housing while also being completely encapsulated by a flexible printed circuit element material such as polyimide. This may, in some cases, remove the need for an antenna isolation circuit that may be used with antennas external to the meter housing in order to protect persons from dangerous high voltage potential.

Figure 11:
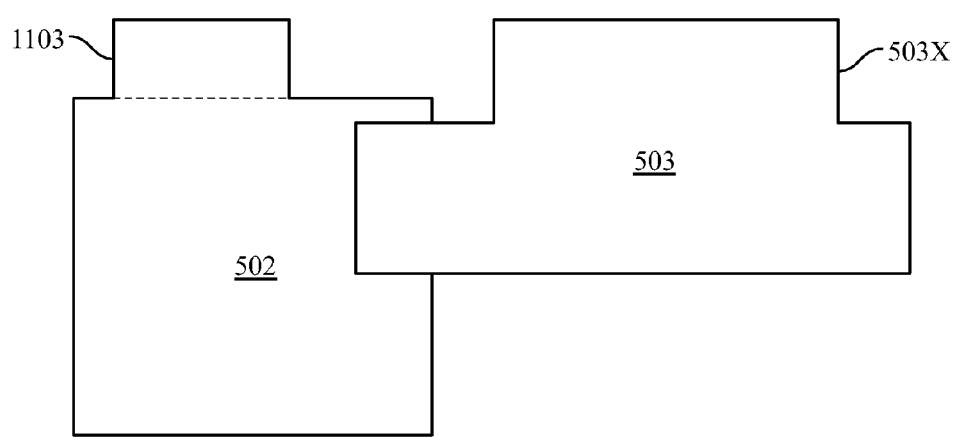
FIG. 11 is a diagram of example flexible extension areas.

FIG. 11 depicts example flexible extension areas. As shown, flexible printed circuit element 503 includes an extension area 503X that may protrude outward from slot 1003 as depicted in FIG. 10. As also shown in FIG. 11, second printed circuit board element 502 is connected to a second flexible printed circuit element 1103. The second flexible printed circuit element 1103 may, in some cases, be folded back toward the center of the meter top housing 701B and may, in some cases, provide additional shielding from noisy electronics within the meter in addition to that provided by the ground plane 902 on the second printed circuit board element 502. Second flexible printed circuit element 1103 may, in some cases, comprise identical or similar material as flexible printed circuit element 503 (including, in some cases, extension area 503X). Additionally, in some cases, substantial portions of one or both sides of the second flexible printed circuit element 1103 may include a ground plane, which may provide additional shielding.

Figure 12:
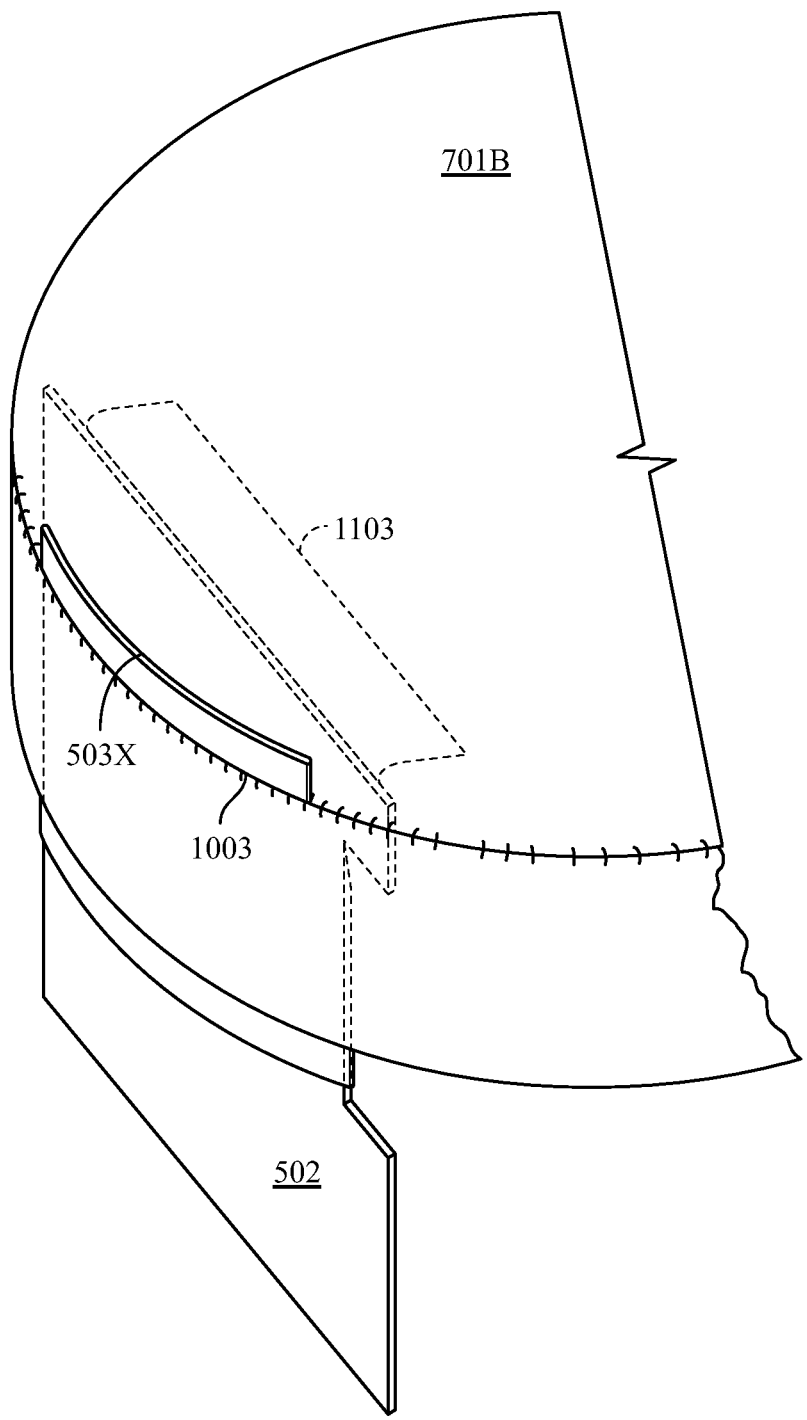
FIG. 12 depicts an example electricity meter housing with flexible extensions.

FIG. 12 depicts an example electricity meter housing with flexible extensions. As shown, extension area 503X of flexible printed circuit element 503 protrudes outward from slot 1003 similar to the depiction of FIG. 10. Additionally, second flexible printed circuit element 1103 extends underneath and along meter top housing 701B. Second flexible printed circuit element 1103 extends from second printed circuit board element 502 towards the center of the meter top housing 701B. In some cases, second flexible printed circuit element 1103 may extend further towards the center of the meter top housing 701B, which may provide additional shielding from electrical components located elsewhere within the meter.

Figure 13:
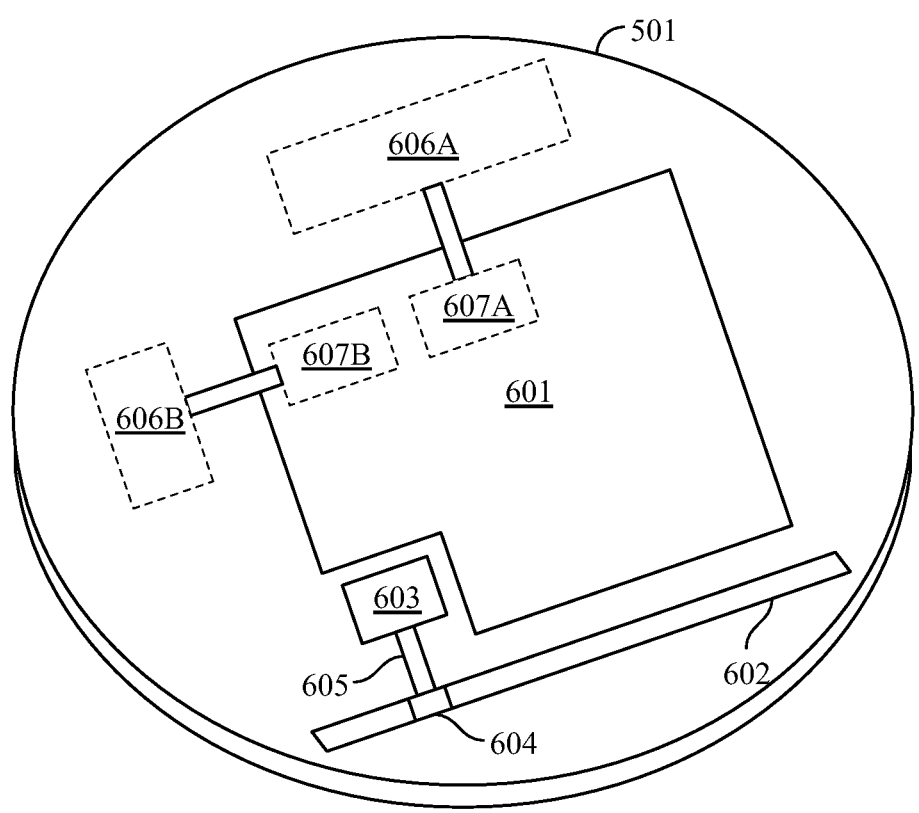
FIG. 13 is a diagram of an example first printed circuit board element including printed antenna elements.

In some cases, an electricity meter may include multiple radios with multiple antenna elements. Some of these multiple antenna elements may sometimes be printed onto the first printed circuit board element 501. FIG. 13 depicts an example first printed circuit board element including additional printed antenna elements. FIG. 13 is similar to FIG. 6, with the exception that FIG. 13 includes additional antennas 606A-B and additional radios 607A-B. As should be appreciated, in some cases, an electricity meter may include no additional antennas, only one additional antenna or more than two additional antennas. The position of the second rigid circuit board 502 may increase the isolation of antenna element 905 on flexible circuit element 503 from the additional antennas 606A-B It is noted that the disclosed antenna, radio and rigid and flexible printed circuit configurations such as depicted in FIGS. 5-13 and described above are not limited to electricity meters and may be incorporated into other devices. However, as set forth above, the disclosed configurations may be particularly beneficial to electricity meters due to certain characteristics. For example, as set forth above, electricity meters may, in some cases, have a side housing with a round shape, have a small and/or limited size, include multiple radios with multiple antenna components, may include several noisy electrical components, and may include a number of other characteristics that may, in some cases, cause the disclosed configurations to be particularly beneficial.

All or portions of the subject matter disclosed herein may be embodied in hardware, software, or a combination of both. When embodied in software, the methods and apparatus of the subject matter disclosed herein, or certain aspects or portions thereof, may be embodied in the form of program code (e.g., computer executable instructions). This program code may be stored on a computer-readable medium, such as a magnetic, electrical, or optical storage medium, including without limitation, a floppy diskette, CD-ROM, CD-RW, DVD-ROM, DVD-RAM, magnetic tape, flash memory, hard disk drive, or any other machine-readable storage medium, wherein, when the program code is loaded into and executed by a machine, such as a computer or server, the machine becomes an apparatus for practicing the invention. A device on which the program code executes will generally include a processor, a storage medium readable by the processor (including volatile and non-volatile memory and/or storage elements), at least one input device, and at least one output device. The program code may be implemented in a high level procedural or object oriented programming language. Alternatively, the program code can be implemented in an assembly or machine language. In any case, the language may be a compiled or interpreted language. When implemented on a general-purpose processor, the program code may combine with the processor to provide a unique apparatus that operates analogously to specific logic circuits.

While systems and methods have been described and illustrated with reference to specific embodiments, those skilled in the art will recognize that modification and variations may be made without departing from the principles described above and set forth in the following claims. Accordingly, reference should be made to the following claims as describing the scope of the present invention.

What is claimed is:

1. An electricity meter comprising:
  a first printed circuit board element to which are attached one or more electrical components;
  a radio for communicating with one or more external devices using radio communications;
  a flexible printed circuit element comprising at least a portion of an antenna element that assists in providing radio communications capability for the radio; and
  a second printed circuit board element having a largest flat surface that is positioned such that it is non-parallel with respect to a largest flat surface of the first printed circuit board element, wherein the flexible printed circuit element is folded such that it extends along opposite sides of the second printed circuit board element.

2. The electricity meter of claim 1, wherein an electrical connection path between the antenna element and the radio does not include coaxial cable.

3. The electricity meter of claim 1, wherein the largest flat surface of the first printed circuit board element is orthogonal to the largest flat surface of the second printed circuit board element.

4. The electricity meter of claim 1, wherein at least a portion of the second printed circuit board element is positioned between at least one of the one or more electrical components and at least a portion of the flexible printed circuit element.

5. The electricity meter of claim 1, wherein at least one of the one or more electrical components generates noise, and wherein the second printed circuit board element shields at least a portion of the antenna element from the noise generated by the at least one of the one or more electrical components.

6. The electricity meter of claim 1, wherein the second printed circuit board element comprises a ground plane.

7. The electricity meter of claim 1, wherein the electricity meter comprises a housing, wherein the housing comprises a slot, and wherein at least a portion of the flexible printed circuit element protrudes outward through the slot in the housing.

8. The electricity meter of claim 1, wherein the electricity meter comprises a housing, wherein the housing comprises one or more guide slots, and wherein the second printed circuit board element is inserted into each of the one or more guide slots.

9. The electricity meter of claim 1, further comprising one or more board-to-board radio frequency connectors that form an electrical connection between the first printed circuit board element and the second printed circuit board element.

10. The electricity meter of claim 1, wherein a portion of the flexible printed circuit element is laminated onto the second printed circuit board element.

11. The electricity meter of claim 1, wherein the flexible printed circuit element comprises polyimide material.

12. An electricity meter comprising:
  a first printed circuit board element to which is attached a first electrical component;
  a radio for communicating with one or more external devices using radio communications;
  a flexible printed circuit element comprising at least a portion of an antenna element that assists in providing radio communications capability for the radio; and
  a second printed circuit board element, wherein a shortest straight line distance between the first electrical component and at least a portion of the flexible printed circuit element passes through the second printed circuit board element, wherein the flexible printed circuit element is folded such that it extends along opposite sides of the second printed circuit board element.

13. The electricity meter of claim 12, wherein an electrical connection path between the antenna element and the radio does not include coaxial cable.

14. The electricity meter of claim 12, wherein the first electrical component generates noise, and wherein the second printed circuit board element shields at least a portion of the antenna element from the noise generated by the first electrical component.

15. The electricity meter of claim 12, wherein a plurality of electrical components are attached to the first printed circuit board element.

16. The electricity meter of claim 12, wherein a largest flat surface of the second printed circuit board element is positioned such that it is non-parallel with respect to a largest flat surface of the first printed circuit board element.

17. The electricity meter of claim 16, wherein the largest flat surface of the second printed circuit board element is positioned such that it is orthogonal with respect to the largest flat surface of the second printed circuit board element.

18. The electricity meter of claim 12, wherein the second printed circuit board element comprises a ground plane.

19. The electricity meter of claim 12, wherein a portion of the flexible printed circuit element is laminated onto the second printed circuit board element.

* * * * *